(12) United States Patent
Melanson et al.

(10) Patent No.: US 10,033,390 B2
(45) Date of Patent: Jul. 24, 2018

(54) SYSTEMS AND METHODS FOR CLOCK SYNCHRONIZATION IN A DATA ACQUISITION SYSTEM

(71) Applicant: Cirrus Logic, Inc., Austin, TX (US)

(72) Inventors: John L. Melanson, Austin, TX (US); Roderick D. Holley, Spicewood, TX (US); Jaimin Mehta, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 14/747,068

(22) Filed: Jun. 23, 2015

(65) Prior Publication Data

US 2015/0372681 A1 Dec. 24, 2015

Related U.S. Application Data

(60) Provisional application No. 62/016,320, filed on Jun. 24, 2014, provisional application No. 62/022,485, filed on Jul. 9, 2014.

(51) Int. Cl.
*H01L 35/00* (2006.01)
*H01L 37/00* (2006.01)
(Continued)

(52) U.S. Cl.
CPC .............. *H03L 1/028* (2013.01); *H03B 5/32* (2013.01); *H03L 1/026* (2013.01); *H03L 7/0991* (2013.01)

(58) Field of Classification Search
CPC ....... H03L 1/028; H03L 1/026; H03L 7/0991; H03L 1/02; H03L 1/022; H03L 7/099; H03B 5/32; H03B 5/04
(Continued)

(56) References Cited

U.S. PATENT DOCUMENTS 5,892,408 A * 4/1999 Binder ................. H03L 1/026
331/176
7,548,600 B2 6/2009 Laine et al.
(Continued)

FOREIGN PATENT DOCUMENTS

WO 2011093708 A1 8/2011

OTHER PUBLICATIONS

Schodowski, Stanley S., Resonator Self-Temperature-Sensing Using a Dual-Harmonic-Mode Crystal Oscillator, 43 Annual Symposium on Frequency Control, 1989, 6 pages.
(Continued)

*Primary Examiner* — Richard Tan
(74) *Attorney, Agent, or Firm* — Jackson Walker L.L.P.

(57) ABSTRACT

A system may include a sampling circuit, a temperature calibration system, a phase detector, a virtual phase-locked loop, and a sample rate converter. The sampling circuit may be configured to generate a series of digitally-sampled data at a sampling frequency provided by a local clock. The temperature calibration system may be configured to determine a temperature-based timing compensation with respect to the local clock. The phase detector may be configured to estimate an error of the local clock in view of the reference clock. The virtual phase-locked loop may be configured to generate a virtual clock based on the temperature-based timing compensation and the error. The sample rate converter may be configured to generate a corrected series of digitally-sampled data in response to the virtual clock by interpolating the series of digitally-sampled data to correct for the error.

28 Claims, 2 Drawing Sheets

(51) Int. Cl.
  *H03L 1/02*   (2006.01)
  *H03L 7/099*  (2006.01)
  *H03B 5/32*   (2006.01)
(58) Field of Classification Search
  USPC ......... 327/513; 331/1 R, 25, 66, 116 R, 154, 331/158, 176
  See application file for complete search history.

(56) References Cited

U.S. PATENT DOCUMENTS

| | | |
|---|---|---|
| 7,579,919 B1 | 8/2009 | Cao |
| 8,260,580 B2 | 9/2012 | Laine |
| 8,489,661 B2 | 7/2013 | Melanson |
| 2012/0044000 A1 | 2/2012 | Hsieh et al. |
| 2012/0286880 A1* | 11/2012 | Kowada ................. H03L 7/146 331/34 |

OTHER PUBLICATIONS

International Search Report and Written Opinion, International Application No. PCT/US2015/037108, dated Oct. 16, 2015, 13 pages.
Azcondo, F.J. et al., Frequency Correction and Frequency Locked Loop for a Micro-Computercompensated Crystal Oscillator, Robotics, Vision and Sensors, Signal Processing and Control, Proceedings of the International Conference on Industrial Electronics, Control, and Instrumentation, New York, IEEE, U.S., vol. 3, Nov. 15, 1993, pp. 1979-1984.

* cited by examiner

SYSTEMS AND METHODS FOR CLOCK SYNCHRONIZATION IN A DATA ACQUISITION SYSTEM

RELATED APPLICATION

The present disclosure claims priority to U.S. Provisional Patent Application Serial No. 62/016,320, filed Jun. 24, 2014, and U.S. Provisional Patent Application Ser. No. 62/022,485, filed Jul. 9, 2014, each of which are incorporated by reference herein in their entirety.

FIELD OF DISCLOSURE

The present disclosure relates in general to data acquisition systems, and more particularly to data acquisition systems in which synchronization to a time-accurate clock is required or advantageous.

BACKGROUND

In many applications, it is desired to acquire data from numerous distributed sensors. For example, in a seismic data acquisition system, it may be desirable to acquire data from numerous distributed accelerometers or other seismic sensors. In order to accurately compare and process data collected from the various sensors, it is often necessary or advantageous that data samples collected from the various sensors are synchronized to a universal time. For example, in U.S. Pat. No. 7,548,600, the data acquisition system disclosed thereon time stamps samples taken at the clock rate of a crystal oscillator local to the sensor to a reference time derived from an accurate clock measurement (e.g., from a satellite-based positioning system). However, these and similar techniques require that a reference filter for performing the time stamping be calculated "on the fly," for example by interpolation of a highly over-sampled table. Thus, for 24-bit resolution using such techniques, at least 12 bits of oversampling (i.e., a factor of 4096) are needed for such accuracy if linear interpolation is assumed. Accordingly, the reference filter utilizes significant memory, and the size of such memory and the power necessary to retrieve and calculate the reference filter may be disadvantageous. For example, U.S. Pat. No. 8,260,580 notes expense, high computing load, a strong memory constraint, and a high consumption in energy when it describes these or similar techniques. In addition, existing seismic systems may use temperature-controlled crystal oscillators, which may have a high cost and require significant power. Components and techniques that require significant amounts of power may be disadvantageous for use in distributed sensor systems in which sensors are typically battery powered.

The use of a temperature-controlled crystal oscillator may also increase system complexity by requiring a feedback loop programmed in a microcontroller unit. The loop requires synchronization to an accurate clock (e.g., from a satellite-based positioning system), measuring temperature, and using a digital-to-analog converter to control the control voltage of the temperature-controlled crystal oscillator. The microcontroller unit closes the control loop for this virtual phase-locked loop, which further complicates the systems and requires more power.

In addition, correction circuitry of a temperature-controlled crystal oscillator is a significant source of measurement error in existing approaches, and "pulling" of a crystal oscillator in a temperature-controlled crystal oscillator also leads to instability of the oscillator.

SUMMARY

In accordance with the teachings of the present disclosure, one or more disadvantages and problems associated with existing approaches to synchronizing clocks in a data acquisition system may be reduced or eliminated.

In accordance with embodiments of the present disclosure, a system may include a sampling circuit, a temperature calibration system, a phase detector, a virtual phase-locked loop, and a sample rate converter. The sampling circuit may be configured to generate a series of digitally-sampled data at a sampling frequency provided by a local clock. The temperature calibration system may be configured to determine a temperature-based timing compensation with respect to the local clock. The phase detector may be configured to estimate error of the local clock in view of the reference clock. The virtual phase-locked loop may be configured to generate a virtual clock based on the temperature-based timing compensation and the error. The sample rate converter may be configured to generate a corrected series of digitally-sampled data in response to the virtual clock by interpolating the series of digitally-sampled data to correct for the error.

In accordance with these and other embodiments of the present disclosure, a method may include generating a series of digitally-sampled data at a sampling frequency provided by a local clock, determining a temperature-based timing compensation with respect to the local clock, estimating an error of the local clock in view of the reference clock, generating a virtual clock based on the temperature-based timing compensation and the error, and generating a corrected series of digitally-sampled data in response to the virtual clock by interpolating the series of digitally-sampled data to correct for the error.

In accordance with these and other embodiments of the present disclosure, a system may include a digitally-controlled crystal oscillator synchronized to a reference clock and a temperature calibration system for determining a temperature-based timing compensation to be applied to synchronize the crystal oscillator to the reference clock.

In accordance with these and other embodiments of the present disclosure, a method may include synchronizing a digitally-controlled crystal oscillator to a reference clock and determining a temperature-based timing compensation to be applied to synchronize the crystal oscillator to the reference clock.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
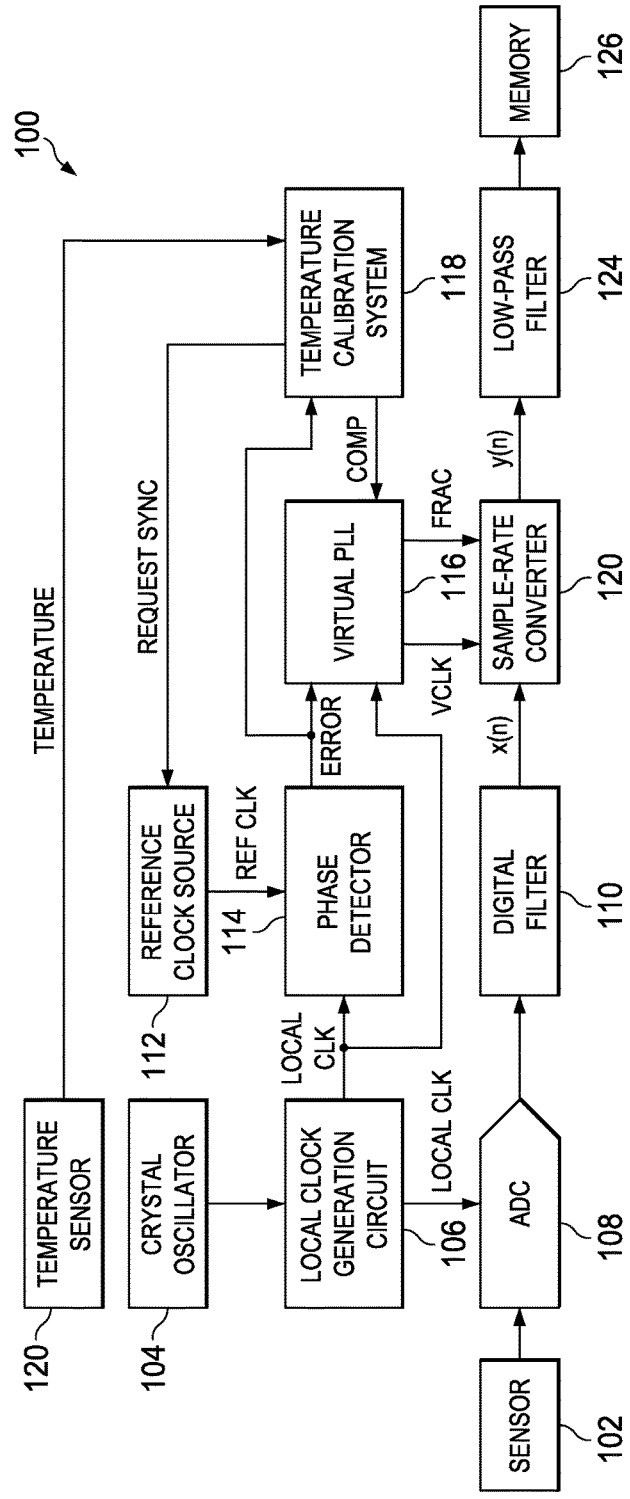
FIG. 1 illustrates selected components of an example data acquisition system, in accordance with embodiments of the present disclosure.

FIG. 1 illustrates selected components of an example data acquisition system 100, in accordance with embodiments of the present disclosure. As shown in FIG. 1, system 100 may include a sensor 102 comprising any suitable system, device, or apparatus for measuring a physical quantity and generating an electrical signal (e.g., voltage or current) indicative of such measured quantity. For example, in some embodiments, sensor 102 may comprise an accelerometer configured to detect an acceleration (e.g., due to gravity) and/or other seismic information.

System 100 may also include a crystal oscillator 104 which may comprise any suitable system, device, or apparatus that uses the mechanical resonance of a vibrating crystal of piezoelectric material to create an electrical signal with a particular frequency. A local clock generation circuit 106 may comprise a frequency divider configured to receive the electrical signal from crystal oscillator 104 and decrease the frequency of the electrical signal by a particular factor (e.g., 16) to generate a local clock signal LOCAL CLK. Local clock signal LOCAL CLK may be communicated to analog-to-digital converter (ADC) 108 as a clock signal for sampling analog signals communicated by sensor 102 at periodic intervals. ADC 108 may also convert analog samples from sensor 102 to corresponding digital samples to generate a digital signal representative of the analog signal output by sensor 102. Such digital signal may be filtered by digital filter 110 which may suppress oversampling noise generated by the ADC 108, and generate an uncorrected digital signal x(n). Thus, ADC 108 and digital filter 110 form a sampling circuit for generating a series of digitally-sampled data x(n) at a sampling frequency provided by local clock signal LOCAL CLK.

A reference clock source 112 may comprise any system, device, or apparatus configured to generate a periodic reference clock signal REF CLK indicative of a time reference to which data generated by system 100 is to be synchronized. For example, in some embodiments, reference clock source 112 may generate reference clock signal REF CLK indicative of an accurate-time signal (e.g., a pulse-per-second signal) generated by the Global Positioning System (GPS), Global Navigation Satellite System (GLONASS), or other satellite-based positioning system.

A phase detector 114 may comprise any suitable system, device, or apparatus configured to generate an error signal ERROR representing an estimated error (e.g., phase error, frequency error, and/or other timing error) of local clock signal LOCAL CLK in view of reference clock signal REF CLK. In some embodiments, timing synchronization with reference clock signal REF CLK may not be continuously performed, in order to conserve power associated with providing reference clock signal REF CLK (e.g., enabling reference clock source 112 and/or satellite-based position system components of system 100). Accordingly, error signal ERROR may only be output when reference clock signal REF CLK is available.

A virtual phase-locked loop (PLL) 116 may receive error signal ERROR, local clock signal LOCAL CLK, and a compensation signal COMP indicative of a temperature-based timing compensation with respect to local clock signal LOCAL CLK and generate, as described in greater detail elsewhere in this disclosure, a virtual clock VCLK corrected to compensate for timing error between local clock signal LOCAL CLK and reference clock signal REF CLK and to compensate for temperature deviation of local clock signal LOCAL CLK, and a fractional conversion value FRAC indicating the fractional amount of a period of local clock signal LOCAL CLK at which virtual clock VCLK occurs. With respect to compensation of timing error, virtual PLL 116 may only perform timing error correction when a reference clock signal REF CLK is available to produce error signal ERROR. In such case, virtual PLL 116 may function as a sample selector similar to that disclosed in U.S. Pat. No. 8,489,661, which is incorporated by reference herein, to generate virtual clock VCLK to define when interpolated samples of uncorrected digital signal x(n) are to be sampled and to generate fractional conversion value FRAC indicative of a fractional offset between successive samples of uncorrected digital signal x(n) at which interpolation by sample rate converter 122 may occur to generate uncorrected digital signal y(n), as described below. In these and other embodiments, virtual PLL 116 may be implemented at least in part by a numerically-controlled oscillator in which error signal ERROR is used to generate virtual clock VCLK which is phase and/or frequency aligned with reference clock signal REF CLK. For example, virtual PLL 116 may be configured to, based on error signal ERROR, calculate a ratio R which is the ratio of occurrences of local clock signal LOCAL CLK to occurrences of reference clock signal REF CLK. Then, the numerically-controlled oscillator may be configured such that it overflows at each occurrence of reference clock signal REF CLK, with an average number of occurrences of local clock signal LOCAL CLK occurring per cycle of reference clock signal REF CLK equal to the ratio R. A time difference between overflow and occurrence of local clock signal LOCAL CLK may equal fractional conversion value FRAC. Thus, the numerically-controlled oscillator may be able to, based on a ratio R, determine fractional conversion value FRAC.

In the absence of reference clock signal REF CLK, virtual PLL 116 may perform temperature based compensation based on compensation signal COMP provided by a temperature calibration system 118. As also described in greater detail elsewhere, temperature calibration system 118 may, based on a temperature as indicated by a signal communicated from a temperature sensor 120, generate compensation signal COMP indicative of a temperature-based timing compensation with respect to local clock signal LOCAL CLK that may compensate for variation in performance of crystal oscillator 104 (e.g., variation in output frequency) in response to changes in temperature at or proximate to crystal oscillator 104. Thus, temperature calibration system 118 may be able to, based on a received signal indicative of a temperature, correlate such temperature to a compensation to be applied with respect to local clock signal LOCAL CLK in order to generate virtual clock VCLK and/or calculate from such temperature the compensation to be applied. In some embodiments, such correlation or calculation may be based on characterization and testing of system 100 or systems similar to system 100 in order to generate a lookup table or define an equation (e.g., a polynomial) to convert measured temperature to a compensation value. In these and other embodiments, such correlation or calculation may be adaptive in the sense that during operation of system 100, values in a lookup table or coefficients of an equation characterizing compensation may be updated based on a sensed temperature and an actual error associated with such temperature, as indicated by error signal ERROR.

Temperature sensor 120 may comprise any suitable system, device, or apparatus for generating an electrical signal (e.g., voltage or current) based on a temperature associated with such temperature sensor 120. For example, in some embodiments, temperature sensor 120 may comprise a thermistor. As another example, in some embodiments, crystal oscillator 104 may comprise a dual-harmonic mode crystal oscillator such as described in S. Schodowski, "Resonator Self-Temperature-Sensing Using a Dual-Harmonic-Mode Crystal Oscillator," 43rd *Annual Symposium on Frequency Control,* 1989, and incorporated by reference herein). In such embodiments, temperature sensor 120 may comprise crystal oscillator 104 and may be configured to sense temperature based on an overtone resonance frequency-temperature characteristic of crystal oscillator 104.

In some embodiments, compensation signal COMP generated by temperature calibration system 118 may comprise ratio R as described above, and virtual PLL 116 may determine fractional conversion value FRAC based on ratio R, such as described above. Accordingly, in the absence of reference clock signal REF CLK from which system 100 can determine an actual error of local clock signal LOCAL CLK to an accurate time, temperature calibration system 118 may predict the timing error based on a sensed temperature from temperature sensor 120.

Figure 2:
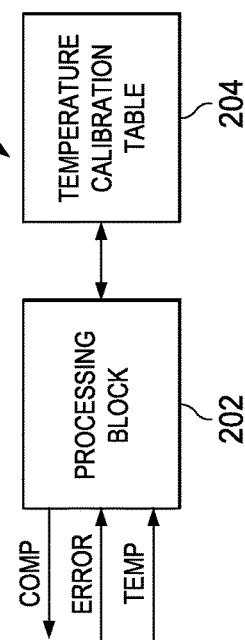
FIG. 2 illustrates selected components of an example temperature calibration system, in accordance with embodiments of the present disclosure.

Turning briefly to FIG. 2, which illustrates selected components of an example temperature calibration system 118, in accordance with embodiments of the present disclosure, temperature calibration system 118 may include a processing block 202 and a temperature calibration table 204. Processing block 202 may include any system, device, or apparatus configured to receive error signal ERROR and a temperature signal TEMP and, based on such signals and information stored in temperature calibration table 204, determine and generate compensation signal COMP to be communicated to virtual PLL 116 (which, as described above, may comprise a ratio R for controlling a numerically-controlled oscillator implemented by virtual PLL 116). Temperature calibration table 204 may comprise a table, list, map, database, or other data structure that includes information for converting a measured temperature into a corresponding value for compensation signal COMP. For example, in some embodiments, calibration table 204 may include a lookup table correlating various values of measured temperature to corresponding values of compensation signal COMP. In other embodiments, calibration table 204 may comprise coefficient values of a polynomial or other function for converting a measured temperature into a corresponding value of compensation signal COMP. In either event, initial information stored in temperature calibration table 204 may be based on a factory calibration of system 100 that characterizes frequency of crystal oscillator 104 over temperature. In some embodiments, values stored in temperature calibration table 204 may be adaptive, in that while in operation, processing block 202 may, based on error signal ERROR and a temperature TEMP, update information stored in temperature calibration table 204 to dynamically update for changes in frequency performance of crystal oscillator 104 with respect to temperature.

In these and other embodiments, temperature calibration system 118 may determine a value of compensation signal COMP on an instantaneous measured temperature, but based on previous measured temperatures. For example, in some embodiments, compensation signal COMP may be determined based on a rate of change of measured temperature. In these and other embodiments, compensation signal COMP may be determined based on a hysteresis of a measured temperature. As an example of determination of compensation signal COMP based on a hysteresis of a measured temperature, compensation signal COMP may be based on whether a measured temperature is increasing or decreasing (e.g., such that a different function may be applied to calculate compensation signal COMP when temperature is increasing than if temperature is decreasing) and a temperature extreme that occurred before temperature began increasing or decreasing (e.g., such that for an increasing temperature, a different function may be applied to calculate compensation signal COMP if the temperature prior to such increase is a first temperature than if the temperature were a second temperature prior to such increase).

Turning again to FIG. 1, as described in greater detail elsewhere in this disclosure, a sample-rate converter 122 may receive virtual clock signal VCLK and fractional conversion value FRAC, and based thereon, convert uncorrected digital signal x(n) into corrected digital signal y(n). Corrected digital signal y(n) may comprise a corrected series of digitally-sampled data in response to virtual clock VCLK and fractional conversion value FRAC by interpolating the series of digitally-sampled data to correct for error ERROR and/or temperature-based frequency deviation in the performance of crystal oscillator 104. Accordingly, samples of corrected digital signal y(n) may be synchronized to an accurate-time clock (e.g., virtual clock VCLK) based on reference clock signal REF CLK.

Figure 3:
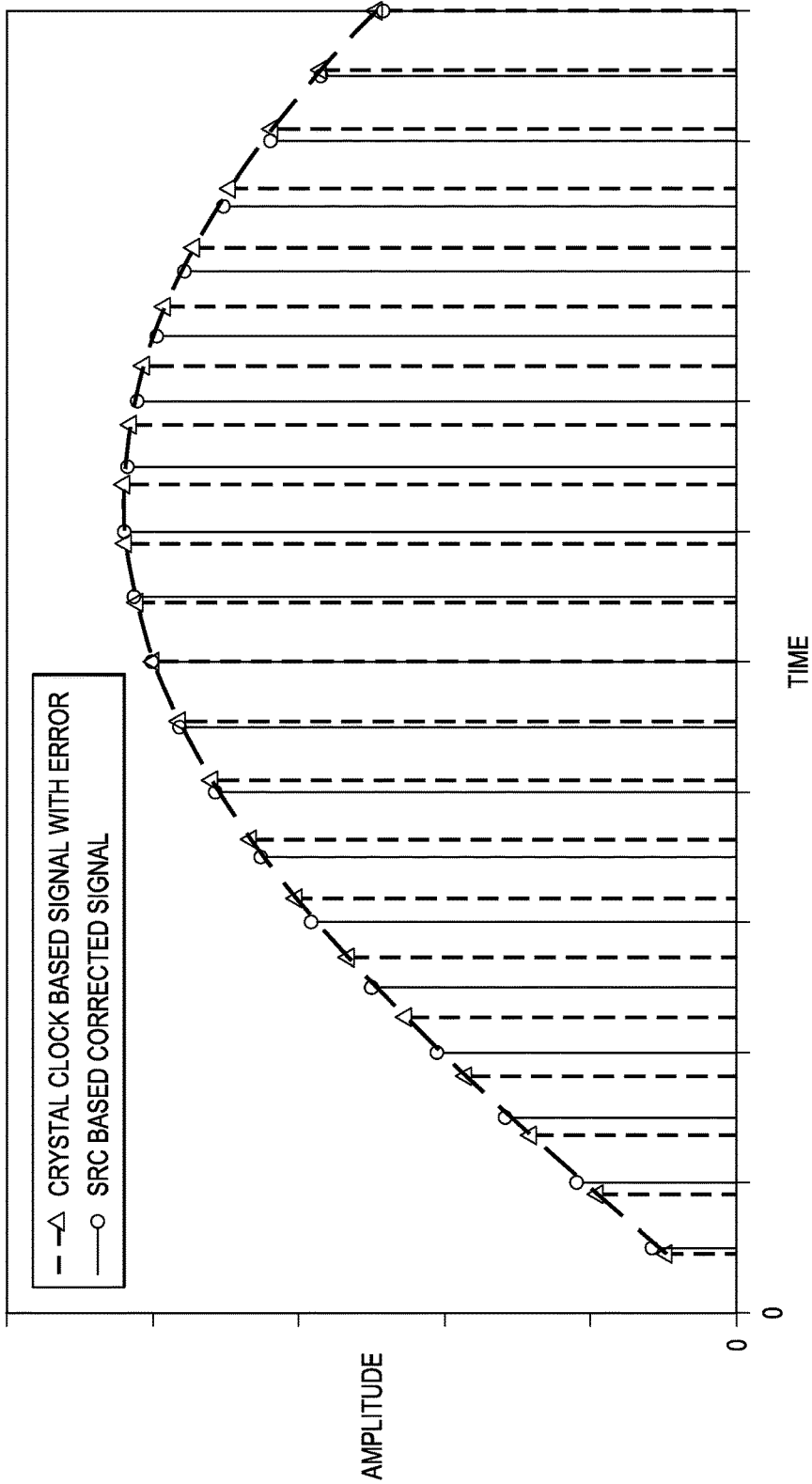
FIG. 3 illustrates a graph depicting correction by a sample rate converter of an uncorrected digital signal to a corrected digital signal, in accordance with embodiments of the present disclosure.

FIG. 3 illustrates a graph depicting correction by sample rate converter 122 of an uncorrected digital signal x(n) represented by dotted vertical lines in FIG. 3 to a corrected digital signal y(n) represented by solid vertical lines, in accordance with embodiments of the present disclosure. Values of uncorrected digital signal x(n) represented by the dotted vertical lines depict sampling of an analog signal by ADC 108 with local clock signal LOCAL CLK and values of corrected digital signal y(n) represented by the solid vertical lines depict correction and resynchronization to an accurate-time clock (e.g., virtual clock VCLK) based on reference clock signal REF CLK, generated by sample rate converter 122 based on the received virtual clock VCLK and fractional conversion value FRAC.

A low-pass filter 124 may filter corrected digital signal y(n) in order to decimate corrected digital signal y(n) to its Nyquist sampling frequency (e.g., to ensure efficient use of memory in storing the signal. The resulting filtered corrected digital signal y(n) may be stored to a memory 126.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the invention and the concepts contributed by the inventor to furthering the art, and are construed as being without limitation to such specifically recited examples and conditions. Although embodiments of the present inventions have been described in detail, it should be understood that various changes, substitutions, and alterations could be made hereto without departing from the spirit and scope of the disclosure.

What is claimed is:

1. A system comprising:
 a sampling circuit for generating a series of digitally-sampled data at a sampling frequency provided by a local clock;
 a temperature calibration system for determining a temperature-based timing compensation with respect to the local clock;
 a phase detector for estimating error of the local clock in view of a reference clock;
 a virtual phase-locked loop for generating a virtual clock based on the temperature-based timing compensation and the error; and
 a sample rate converter for generating a corrected series of digitally-sampled data in response to the virtual clock by interpolating the series of digitally-sampled data to correct for the error and temperature-based frequency deviation in the local clock.

2. The system of claim 1, wherein the local clock is generated by a crystal oscillator.

3. The system of claim 2, wherein the temperature calibration system comprises a temperature sensor for sensing a temperature proximate to the crystal oscillator.

4. The system of claim 3, wherein the crystal oscillator comprises a dual-harmonic mode crystal oscillator and the temperature sensor comprises the crystal oscillator and is configured to sense a temperature based on an overtone resonance frequency-temperature characteristic of the crystal oscillator.

5. The system of claim 1, wherein the sampling circuit is an analog-to-digital converter.

6. The system of claim 1, wherein the error comprises a timing error.

7. The system of claim 6, wherein the timing error comprises at least one of a frequency error and a phase error.

8. The system of claim 1, wherein the reference clock is generated based on a periodic timing signal provided by a satellite-based positioning system.

9. The system of claim 1, wherein the temperature calibration system comprises a lookup table correlating temperature information to temperature-based timing compensation.

10. The system of claim 1, wherein the temperature calibration system is configured to apply a polynomial function to the temperature information to generate the temperature-based timing compensation.

11. The system of claim 1, wherein the temperature calibration system determines the temperature-based timing compensation based on a rate of change of a measured temperature.

12. The system of claim 1, wherein the temperature calibration system determines the temperature-based timing compensation based on a hysteresis of a measured temperature.

13. The system of claim 12, wherein the temperature-based timing compensation is based on:
 whether the measured temperature is increasing or decreasing; and
 an extreme temperature of the measured temperature.

14. The system of claim 1, wherein the temperature calibration system predicts a timing error based on temperature information and generates the temperature-based timing compensation based on such prediction.

15. A method comprising:
 generating a series of digitally-sampled data at a sampling frequency provided by a local clock;
 determining a temperature-based timing compensation with respect to the local clock;
 estimating an error of the local clock in view of a reference clock;
 generating a virtual clock based on the temperature-based timing compensation and the error; and
 generating a corrected series of digitally-sampled data in response to the virtual clock by interpolating the series of digitally-sampled data to correct for the error and temperature-based frequency deviation in the local clock.

16. The method of claim 15, wherein the local clock is generated by a crystal oscillator.

17. The method of claim 16, wherein the temperature-based timing compensation is based on a temperature sensed proximate to the crystal oscillator.

18. The method of claim 17, wherein the crystal oscillator comprises a dual-harmonic mode crystal oscillator and the temperature is sensed based on an overtone resonance frequency-temperature characteristic of the crystal oscillator.

19. The method of claim 15, wherein generating a series of digitally-sampled data comprises converting an analog signal to the series of digitally-sampled data.

20. The method of claim 15, wherein the error comprises a timing error.

21. The method of claim 20, wherein the timing error comprises at least one of a frequency error and a phase error.

22. The method of claim 15, wherein the reference clock is generated based on a periodic timing signal provided by a satellite-based positioning system.

23. The method of claim 15, wherein determining the temperature-based timing compensation comprises correlating temperature information to temperature-based timing compensation with a lookup table.

24. The method of claim 15, wherein determining the temperature-based timing compensation comprises applying a polynomial function to the temperature information to generate the temperature-based timing compensation.

25. The method of claim 15, wherein determining the temperature-based timing compensation comprises determining the temperature-based timing compensation based on a rate of change of a measured temperature.

26. The method of claim 15, wherein determining the temperature-based timing compensation comprises determining the temperature-based timing compensation based on a hysteresis of a measured temperature.

27. The method of claim 26, wherein the temperature-based timing compensation is based on:
  whether the measured temperature is increasing or decreasing; and
  an extreme temperature of the measured temperature.

28. The method of claim 15, wherein determining the temperature-based timing compensation comprises predicting a timing error based on temperature information and generating the temperature-based timing compensation based on such prediction.

* * * * *